United States Patent
Lee et al.

(10) Patent No.: US 7,315,211 B1
(45) Date of Patent: Jan. 1, 2008

(54) SLIDING BIAS CONTROLLER FOR USE WITH RADIO FREQUENCY POWER AMPLIFIERS

(75) Inventors: Jongsoo Lee, Gilbert, AZ (US); Edward T. Spears, Gilbert, AZ (US)

(73) Assignee: RF Micro Devices, Inc., Greensboro, NC (US)

(*) Notice: Subject to any disclaimer, the term of this patent is extended or adjusted under 35 U.S.C. 154(b) by 101 days.

(21) Appl. No.: 11/391,500

(22) Filed: Mar. 28, 2006

(51) Int. Cl.
    *H03G 3/10* (2006.01)
(52) U.S. Cl. ................................ 330/285; 330/297
(58) Field of Classification Search .......... 330/133, 330/140, 285, 296, 297, 279
    See application file for complete search history.

(56) References Cited

U.S. PATENT DOCUMENTS

| 6,233,440 | B1  |         | 5/2001  | Taylor                   |
|-----------|-----|---------|---------|--------------------------|
| 6,624,702 | B1  | *       | 9/2003  | Dening ............ 330/297 |
| 6,639,465 | B2  |         | 10/2003 | Samelis et al.           |
| 6,639,471 | B2  | *       | 10/2003 | Matsuura et al. ...... 330/302 |
| 6,741,127 | B2  | *       | 5/2004  | Sasho et al. ......... 330/136 |
| 6,744,321 | B2  |         | 6/2004  | Noh et al.               |
| 6,819,180 | B2  |         | 11/2004 | Krvavac                  |

OTHER PUBLICATIONS

Yang, Kyounghoon et al., "High-Efficiency Class-A Power Amplifiers with a Dual-Bias-Control Scheme," IEEE Transactions on Microwave Theory and Techniques, Aug. 1999, pp. 1426-1432, vol. 47, No. 8, IEEE.

* cited by examiner

*Primary Examiner*—Henry Choe
(74) *Attorney, Agent, or Firm*—Withrow & Terranova, PLLC (57) ABSTRACT

A two stage power amplifier circuit that employs both a DC to DC converter and sliding bias controller to improve power amplifier efficiency. The control signal that is generated by the power detector circuit to control the input voltage to the DC to DC converter is also used to provide the reference voltage that controls the sliding bias controller. The sliding bias controller reduces the quiescent current of the power amplifiers by reducing the bias currents, and thus the DC voltage at lower power output levels driving the power amplifiers. This causes the power amplifiers to operate at or near higher efficiency Class B operation at lower power output levels. As the power level increases, the sliding bias controller reduces its control on the bias currents so that the power amplifier can be driven at necessary higher power output levels.

26 Claims, 9 Drawing Sheets

SLIDING BIAS CONTROLLER FOR USE WITH RADIO FREQUENCY POWER AMPLIFIERS

RELATED APPLICATION

The present application is related to U.S. patent application Ser. No. 11/273,739 entitled "RADIO FREQUENCY POWER DETECTION AND DECISION CIRCUIT USED WITH DC SUPPLY VOLTAGE CONTROLLED POWER AMPLIFIERS," filed on Nov. 15, 2005, incorporated herein by reference in its entirety, and assigned to the same assignee as the present invention.

FIELD OF THE INVENTION

The present invention relates to a bias controller for controlling the bias current to radio frequency (RF) power amplifiers used in RF communication circuitry to improve amplifier operating efficiency.

BACKGROUND OF THE INVENTION

RF power amplifiers are commonly used in RF circuits as the last active stage in RF transmitters. As a result, an RF power amplifier is typically the largest power consumption device in an RF system; therefore, RF power amplifier systems are designed to be as efficient as possible.

One commonly used technique for improving the efficiency of an RF power amplifier is to feed the DC supply voltage of the RF power amplifier with a DC to DC converter, such that the DC supply voltage is adjusted to allow the RF power amplifier to amplify the RF signals to be amplified properly in an efficient manner. For the DC to DC converter to output the appropriate DC supply voltage, it must be provided with an input signal representative of the desired output voltage or power, which is determined from the magnitude of the RF signals being amplified. By using an RF power detector, the magnitude of the RF signals can be measured.

Figure 1:
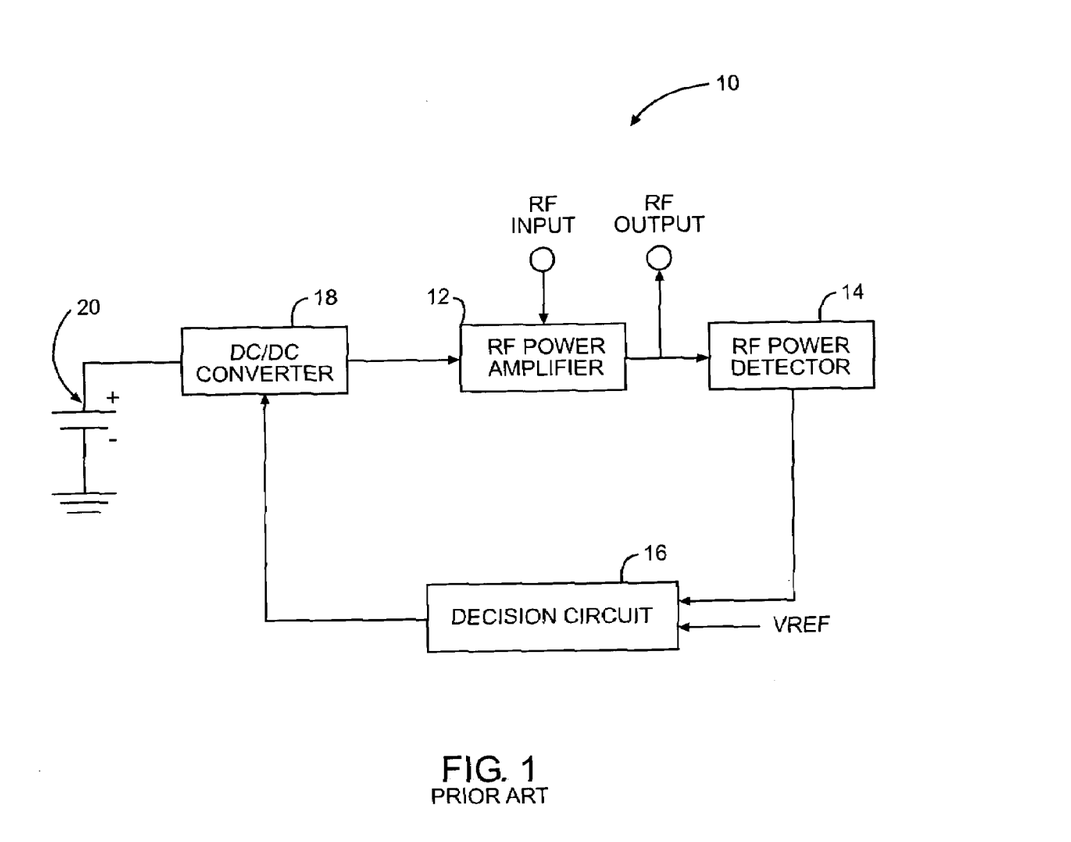
FIG. 1 illustrates how an RF power detector and decision circuit are used with a DC to DC converter and RF power amplifier, which is one example of prior art.

FIG. 1 shows a typical RF power amplifier system 10 employing a DC to DC converter. The RF output of an RF power amplifier 12 is coupled into an RF power detector 14, which creates a DC voltage representation of the detected RF signal, which is then fed into a decision circuit 16. The decision circuit 16 then creates a control voltage for a DC to DC converter 18 using the signal from the RF power detector 14 and a stable, accurate DC reference voltage, called VREF. The DC to DC converter 18 is powered from a DC supply 20, which may be a battery.

Other power amplifier and DC to DC converter circuits may employ different types of envelope detectors or peak detectors as methods of producing a control voltage based on the power of the incoming RF input signal. However, diode based detectors still suffer from other issues such as delay or difficulty operating with small signal levels using phase modulation, and thus may not be suitable for all applications, as is well known.

Figure 2:
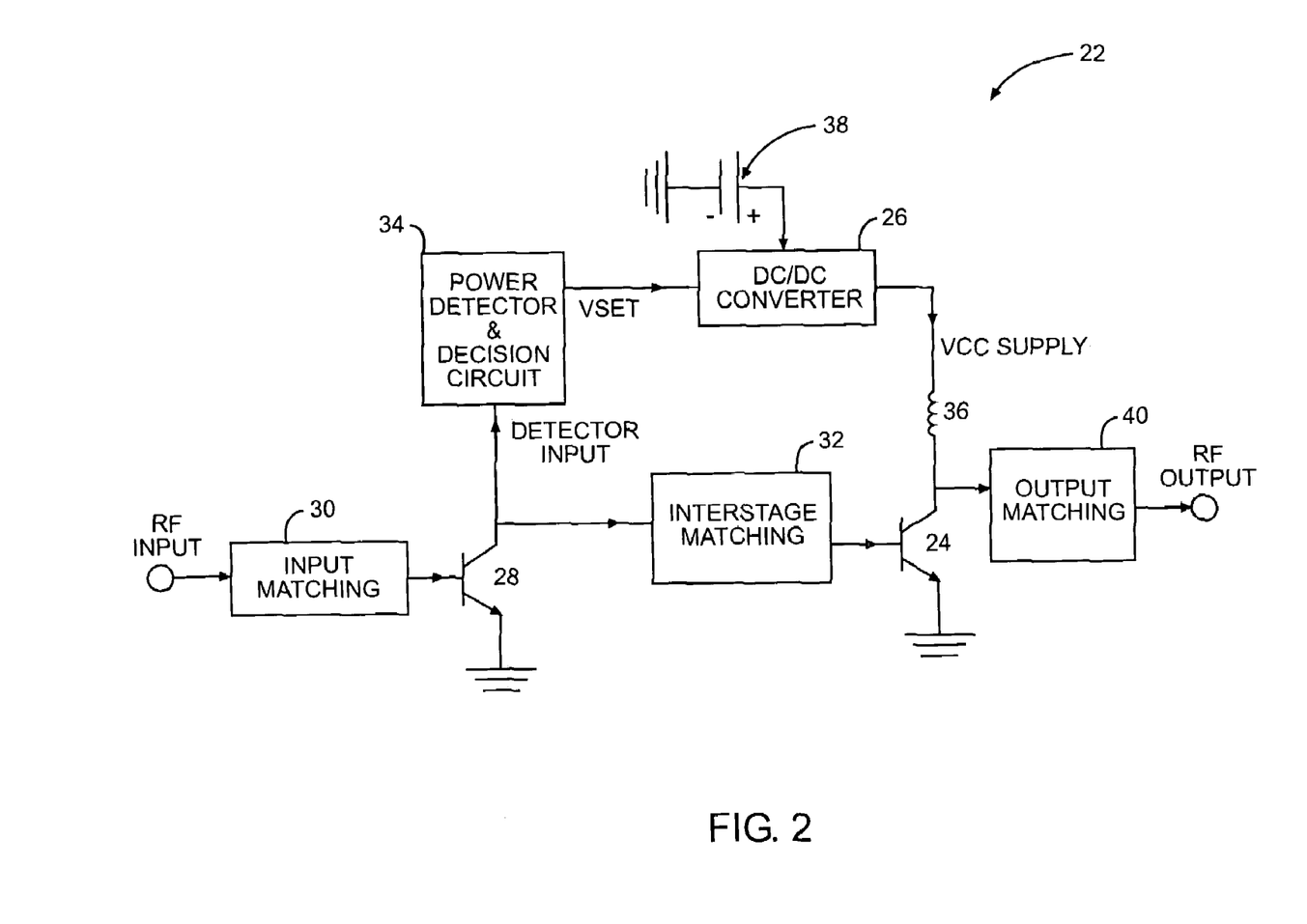
FIG. 2 illustrates a two stage amplifier design with a DC to DC converter.

FIG. 2 illustrates a two stage power amplifier circuit 22 that overcomes the above discussed shortcomings. The amplifier circuit 22 is the subject of the related U.S. patent application Ser. No. 11/273,739 (hereinafter the "'739 application"). The amplifier circuit 22 internally provides both minimum and maximum operating limits for the DC supply voltage to further improve the efficiency. A maximum operating limit ensures the RF output power from the RF power amplifier 12 does not exceed required levels so that regulatory requirements, such as those imposed by the FCC, thermal limits, and power consumption limits are met. A minimum operating limit ensures that the RF power amplifier 12 has adequate DC supply voltage to operate properly and satisfying linearity requirements of communications standards.

As illustrated in FIG. 2, the DC supply voltage to a final stage 24 is controlled by a DC to DC converter 26. The RF power is detected at the output of a first stage 28. The RF input (RF INPUT) feeds an input matching network 30, which then feeds the first stage 28. The output of the first stage 28 then feeds an interstage matching network 32 and a power detector and decision circuit 34, which detects the RF power from the first stage 28 and generates a DC control voltage, called VSET, for the DC to DC converter 26. The DC to DC converter 26 provides the DC supply voltage, called VCC SUPPLY, to the final stage 24 through a filter inductor 36. The DC to DC converter 26 is powered from a DC supply 38, which may be a battery. The interstage matching network 32 feeds the final stage 24 which drives the RF output through an output matching network 40 to generate the RF output signal (RF OUTPUT).

Figure 3:
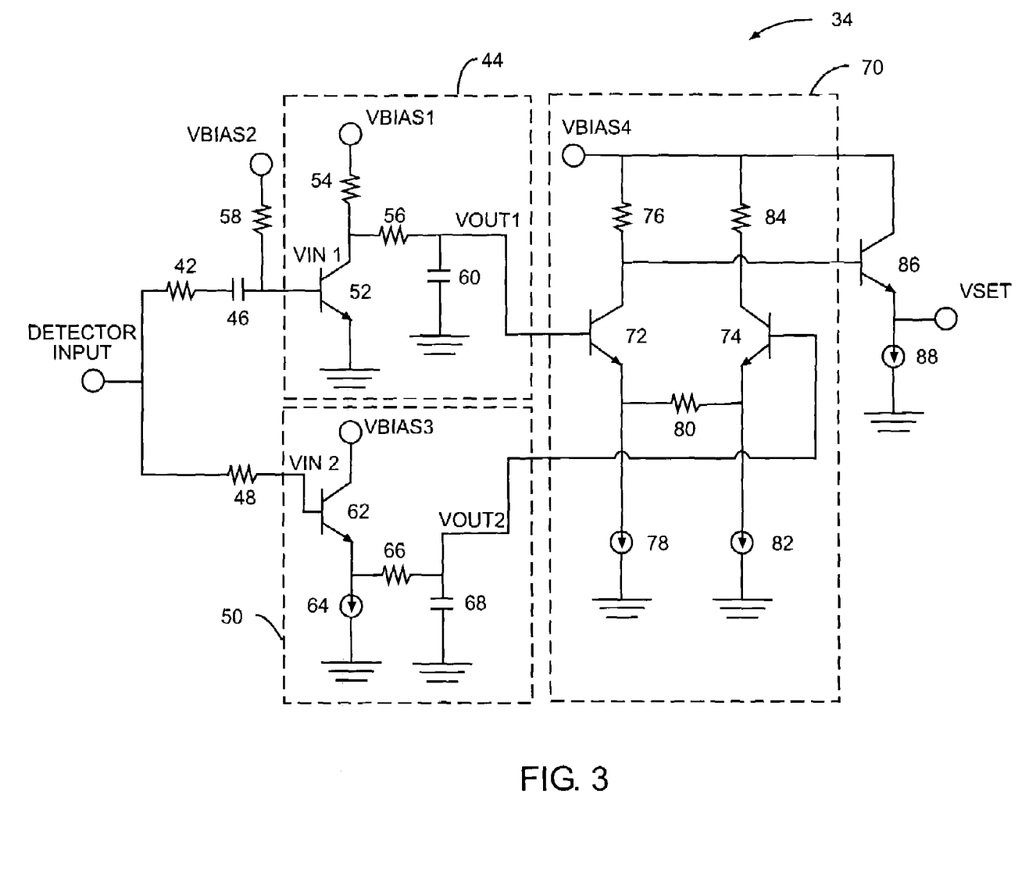
FIG. 3 illustrates a bipolar power detector and decision circuit that may be used in the two stage amplifier design of FIG. 2 to provide a voltage to the DC to DC converter having minimum and maximum operating limits.

FIG. 3 illustrates a bipolar power detector and decision circuit disclosed in the '739 application that is one embodiment of the two stage power detector and decision circuit 34 illustrated in FIG. 2. The detector input feeds two attenuator resistors. A first attenuator resistor 42 feeds a common emitter amplifier 44 through a coupling capacitor 46. A second attenuator resistor 48 feeds a common collector amplifier 50. The resistance values of the resistors 42, 48 can be relatively high to minimize loading of the detector circuit 34 input. The resistor values may be greater than 500 ohms.

The common emitter amplifier 44 is comprised of a common emitter amplifier transistor 52 whose collector drives a common emitter amplifier load resistor 54 and a common emitter amplifier filter resistor 56. The common emitter amplifier load resistor 54 is connected to a DC supply voltage, called VBIAS1. The base of the common emitter amplifier transistor 52 is connected to a DC bias voltage, called VBIAS2, through a common emitter amplifier bias resistor 58 thereby creating VIN1 at the base. The common emitter amplifier filter resistor 56 feeds a common emitter amplifier filter capacitor 60, which provides the common emitter amplifier 44 DC output signal, called VOUT1. The common emitter amplifier filter resistor 56 and the common emitter amplifier filter capacitor 60 filter the RF signal to create the DC output signal.

The common collector amplifier 50 is comprised of a common collector amplifier transistor 62 whose emitter drives a common collector amplifier current source 64 and a common collector amplifier filter resistor 66. Voltage VIN2 is provided at the base of the common collector amplifier 62. The collector of the common collector amplifier transistor 62 is connected to a DC supply voltage, called VBIAS3. The common collector amplifier filter resistor 66 feeds a common collector amplifier filter capacitor 68, which provides the common collector amplifier 50 DC output signal, called VOUT2. The common collector amplifier filter resistor 66 and the common collector amplifier filter capacitor 68 filter the detector input signal to create the DC output signal.

VOUT1 and VOUT2 feed the inputs of a differential decision circuit 70, which is comprised of a primary side and a secondary side. VOUT1 feeds the base of a primary side transistor 72 and VOUT2 feeds the base of a secondary side transistor 74. The collector of the primary side transistor 72 drives a primary side load resistor 76 and provides the output from the differential decision circuit 70. The primary side load resistor 76 is connected to a DC supply voltage, called VBIAS4. The emitter of the primary side transistor 72 is connected to a primary side current source 78 and a common emitter resistor 80. The other end of the common emitter resistor 80 is connected to a secondary side current source 82 and the emitter of the secondary side transistor 74. The collector of the secondary side transistor 74 drives a secondary side load resistor 84, which is connected to VBIAS4. The output from the differential decision circuit 70 drives a common collector buffer amplifier comprising a buffer transistor 86 and a buffer current source 88. The emitter of the buffer transistor 86 provides VSET.

Figure 4:
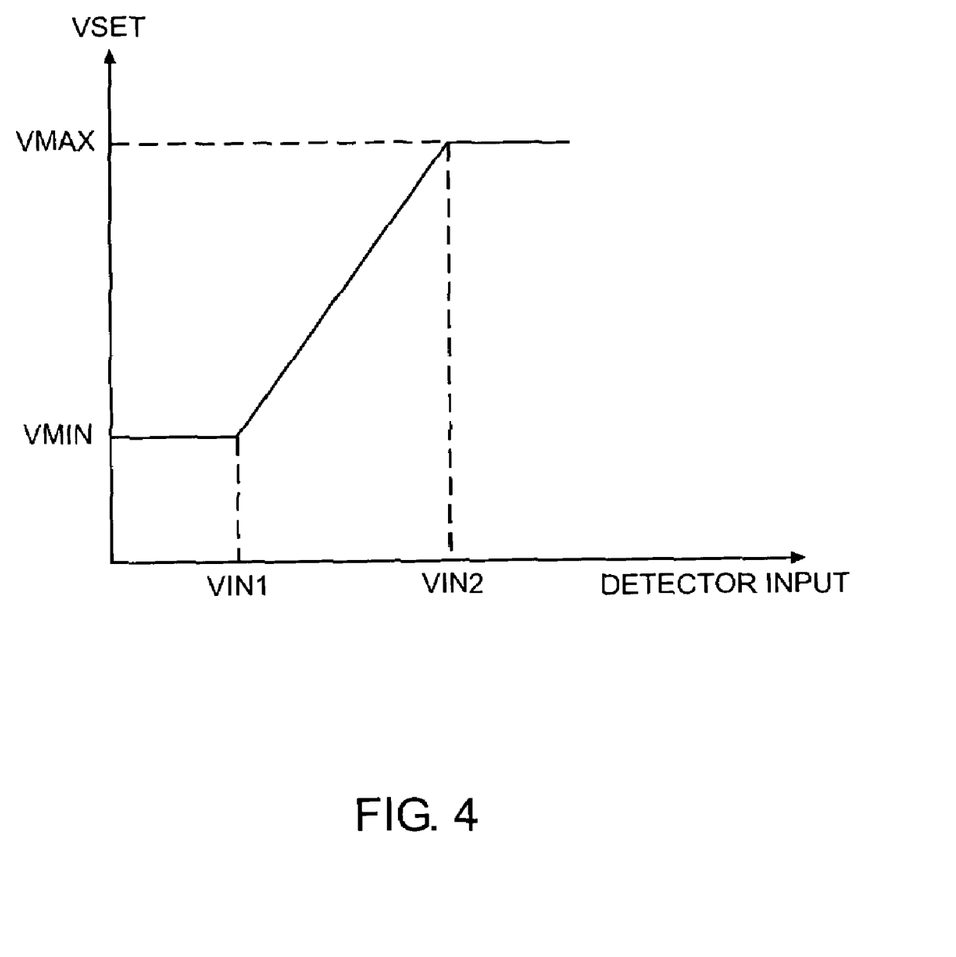
FIG. 4 illustrates the output response of the bipolar power detector and decision circuit illustrated in FIG. 3.

FIG. 4 illustrates the response of the power detector and decision circuit 34. If the detector circuit 34 input is less than VIN1, the primary side transistor 72 is active; therefore, VSET will be the value of VMIN. VMIN is determined by the value of VBIAS4 and the voltage drop across the primary side load resistor 76 due to the current being drawn by the primary side current source 78 and the secondary side current source 82 through the common emitter resistor 80.

If the detector 34 input is greater than VIN2, the primary side transistor 72 is off; therefore, VSET will be the value of VMAX. VMAX is determined by the value of VBIAS4, since the voltage drop across the primary side load resistor 76 is virtually zero. The response of the power detector and decision circuit 34 when the detector input is between VIN1 and VIN2 can be adjusted by changing the value of the common emitter resistor 80.

Figure 5:
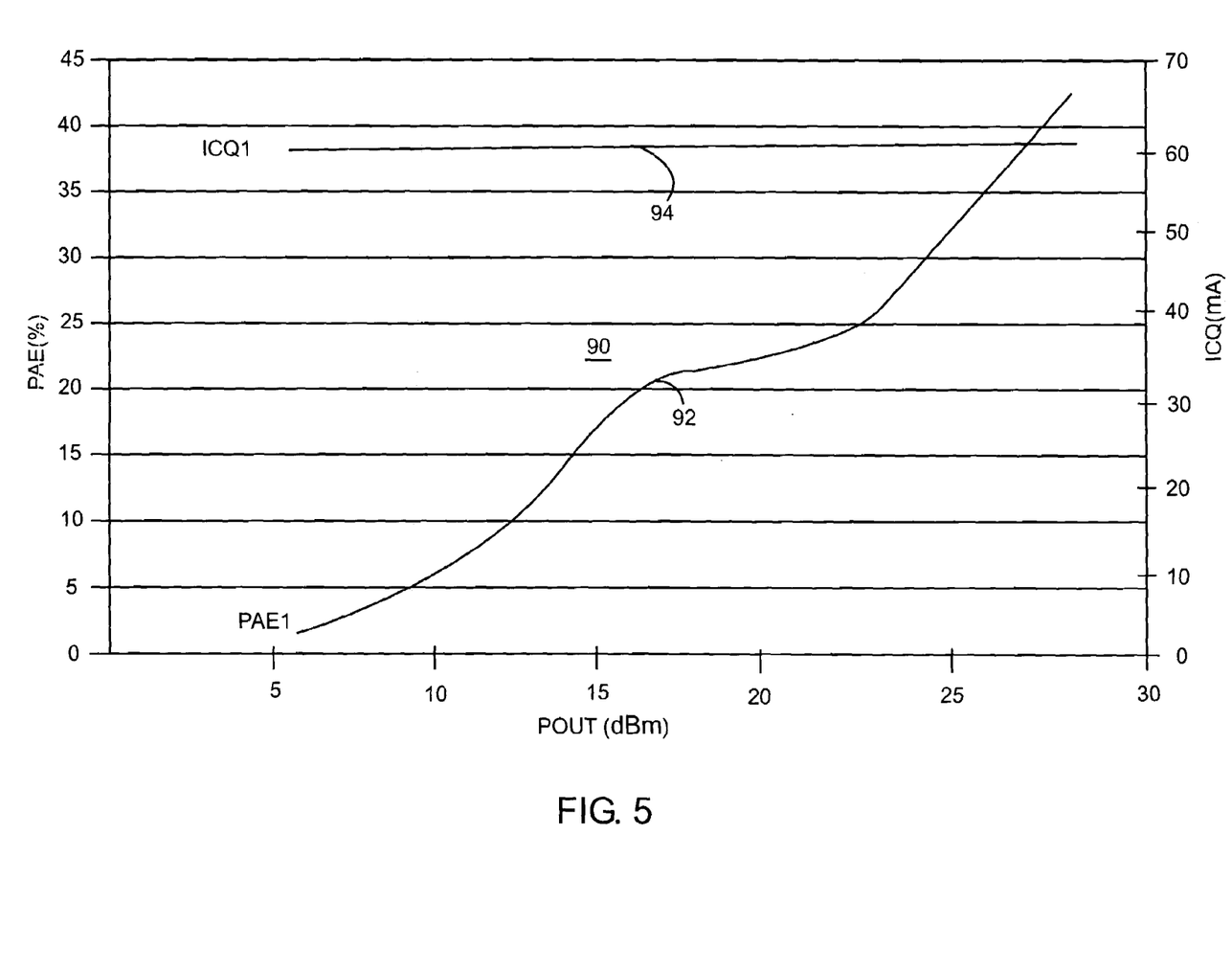
FIG. 5 illustrates an example of power amplifier efficiency curve of the power amplifier circuit of FIG. 2 demonstrating the effect of the amplifier quiescent current.

FIG. 5 illustrates an exemplary operational efficiency 90 of the final stage power amplifier 24, which illustrated in FIG. 2 and employs the bipolar power detector and decision circuit 34 of FIG. 3. The operating efficiency is the ratio of RF power to DC power consumption of an amplifier if the gain of the amplifier is large. The power amplifier efficiency (PAE1) curve 92 demonstrates a higher efficiency at higher power output (Pout) levels, but demonstrates a lower efficiency at lower power output levels. The PAE1 at high output power is improved as a result of employing the DC to DC converter 26 producing the DC supply voltage (VCC SUPPLY) controlling the second stage amplifier 24. A quiescent current (ICQ1) 94 of the second stage amplifier 24 is almost constant over the entire power output level range of the final stage power amplifier 24 regardless of VCC SUPPLY or power output level. Notably, the overall power consumption at lower power output levels is mainly attributed to the quiescent current and not amplification. Given the need to reduce power consumption, there is a need to reduce quiescent current when possible without effecting amplifier performance.

SUMMARY OF THE INVENTION

The present invention is a two stage power amplifier circuit that employs a sliding bias controller to reduce bias currents controlling the power amplifiers from their nominal levels at lower power output levels, thereby reducing the quiescent currents and improving power amplifier efficiency. Quiescent current is the current generated by the power amplifier when no input signal is present. At lower power output levels, reducing the quiescent currents allows the power amplifiers to operate using less current consumption to reduce DC power consumption and improve power amplifier efficiency. At higher power output levels, the sliding bias controller does not change the bias currents from their nominal levels so that bias currents are sufficient to operate the power amplifier at the necessary power output levels. This causes the power amplifiers to operate at or near higher efficiency Class B operation at lower output power levels, but at normal Class AB operation at higher output power levels.

A controllable supply voltage, such as a DC to DC converter, is also employed to control the supply voltage to the final stage power amplifier to further improve power amplifier efficiency.

A power level signal indicative of the power level of an input RF signal and generated by a power detector circuit is used to provide a voltage reference signal to both the DC to DC converter and the sliding bias controller. Thus, integration of the present invention with existing power amplifier circuits employing a power detector circuit that provides a control voltage to a controllable voltage supply is easily achieved. No extra reference generator is used for the sliding bias controller. Further, because the same power level signal is used as the reference signal to control the sliding bias controller and to control the controllable voltage supply, which generates the power amplifier supply voltage, extra calibration time that would be needed to calibrate two different reference signals for the sliding bias controller and the controllable voltage supply is eliminated.

Further, because the power detector is operating at high speeds, there are no bandwidth issues that affect the quiescent currents generated by the bias circuits when using the output of the power detector circuitry as the power level input into the sliding bias controller to ultimately control the bias currents generated by the bias circuits and thus the quiescent currents. The power detector may employ a high bandwidth low pass filter that is easily integrated into a monolithic microwave integrated circuit (MMIC).

The present invention can be implemented using any transistor technology such as Metal Oxide Semiconductor Field Effect Transistor (MOSFET) technology, Junction Field Effect Transistor (JFET) technology, or bipolar technology.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE INVENTION

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 6:
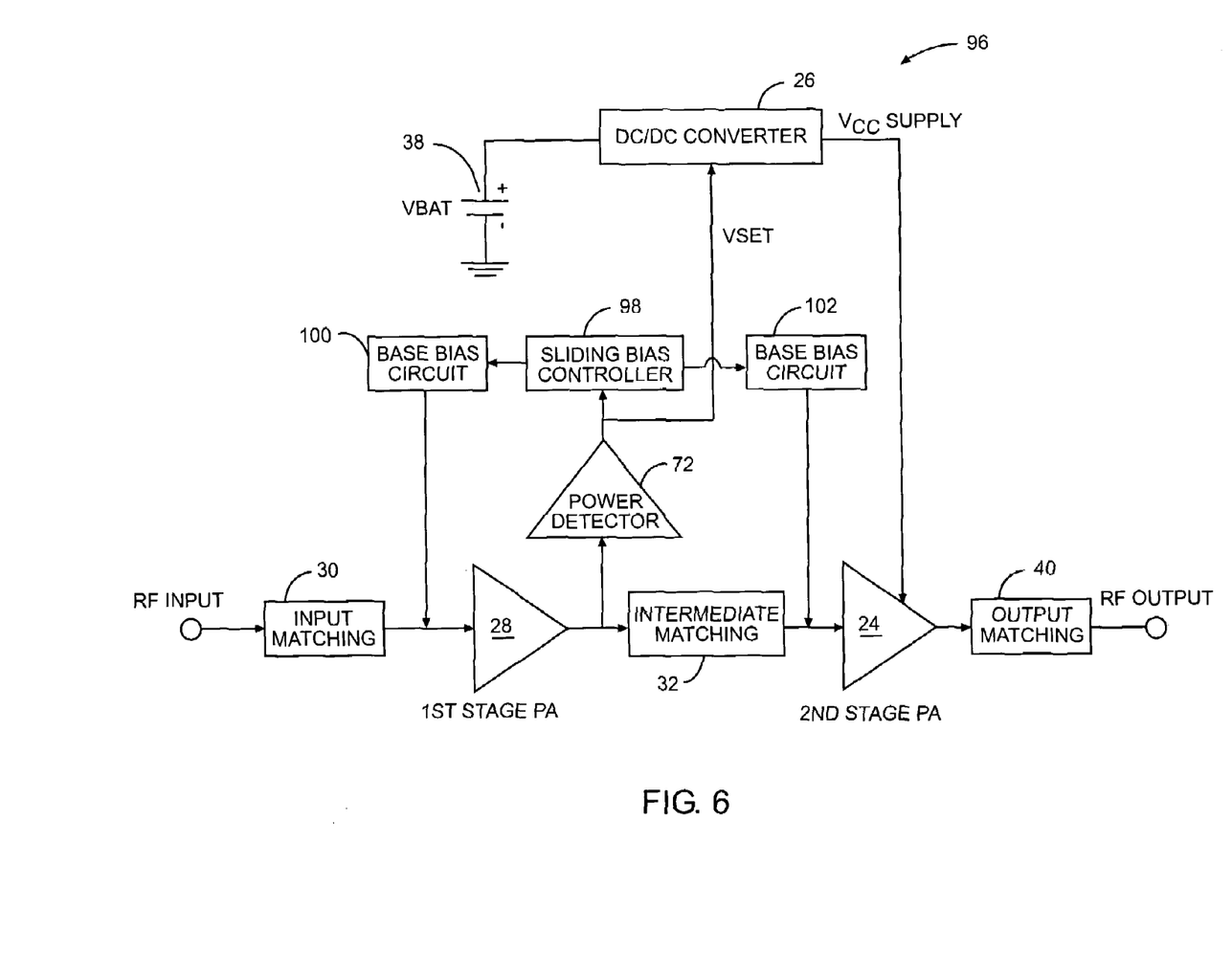
FIG. 6 illustrates a schematic diagram of the present invention employing a power detector and sliding bias controller to control the input signal to the DC to DC converter and base bias current for amplifier stage to reduce the quiescent current at lower RF input signal levels.

FIG. 6 illustrates a two stage power amplifier circuit 96 that employs a sliding bias controller 98 to control the bias currents of the power amplifier stages 24, 28 and thus the quiescent currents of the power amplifier stages 24, 28 as a result. The bias currents are generated by base bias circuit 100 and base bias circuit 102 to control the operation of the power amplifiers 24, 28. At lower power output levels, the sliding bias controller 98 reduces the bias currents from their nominal levels thereby reducing the quiescent currents. This allows the power amplifiers 24, 28 to operate using less current consumption to reduce DC power consumption and improve power amplifier efficiency as a result.

As the power level increases, the sliding bias controller 98 no longer reduces the bias currents from their nominal levels in order to properly drive the power amplifiers 24, 28 at necessary higher power output levels. Thus at higher output levels, the sliding bias controller 98 does not reduce the bias currents from their nominal levels. This allows the power amplifiers 24, 28 to generate the gains necessary for higher power output levels without compromising power amplifier 24, 28 efficiencies, since the power output level is sufficiently high to dominate the effect of the quiescent currents on power amplifier 24, 28 efficiency.

In one embodiment, the invention allows the power amplifiers 24, 28 to operate at or near higher efficiency Class B operation at lower output power levels due to the lower quiescent currents lowering current consumption. At higher power output levels, the power amplifiers 24, 28 operate at normal Class AB operation.

The DC supply voltage (VCC SUPPLY) provided to the final stage amplifier 24 is controlled by the DC to DC converter 26, which is also employed to further improve efficiency, as discussed in the "Background of the Invention" section above and in the '739 application. The RF power is detected at the output of the first, prior stage 28 using the power detector circuitry 34. The RF input signal (RF INPUT) feeds the input matching network 30, which then feeds the first stage amplifier 28. The output of the first stage amplifier 28 then feeds the interstage matching network 32 and the power detector and decision circuit 34. The power detection and decision circuit 34 detects the RF power from the first stage 28 and generates a DC control voltage (VSET) for the DC to DC converter 26 based on the RF power. The DC to DC converter 26 provides a variable DC supply voltage (VCC SUPPLY) to the final stage 24 based on the DC control voltage (VSET). The DC to DC converter 26 is powered from the DC supply 38, which may be a battery. The interstage matching network 32 feeds the final stage 24 which drives the RF output through the output matching network 40 to generate the RF output signal (RF OUTPUT).

The control signal (VSET) that is generated by the power detector circuit 34 to control the input voltage to the DC to DC converter 26 is also used to provide the power level of the RF input signal (RF INPUT) to the sliding bias controller 98. Thus, integration of the present invention with existing power amplifier circuits employing a power detector circuit that provides a control voltage to a controllable voltage supply is easily achieved. No extra reference generator is used for the sliding bias controller 98.

Further, because the same power level signal (VSET) is used as the reference signal to control both the sliding bias controller 98 and the DC to DC converter 26, extra calibration time that would be needed to calibrate two different reference signals for the sliding bias controller and the DC to DC converter 26 can be eliminated. This is because the power amplifier supply voltage (VCC SUPPLY) that controls the operation of the final stage power amplifier 24 affects the relationship between a given bias voltage and the power amplifier 24 quiescent current. The sliding bias controller 98 must be designed to reduce the bias current to reduce the quiescent current of the power amplifier 24 in proper relation to the power amplifier supply voltage (VCC SUPPLY). Thus, use of the same power level signal (VSET) to control both the sliding bias controller 98 and the supply voltage (VCC SUPPLY) in effect calibrates the relationship between the two without extra calibration time or procedures required.

Further, because the power detector 34 is operating at high speeds, there are no bandwidth issues that affect the quiescent currents generated by the base bias circuits 100, 102 when using the output of the power detector circuitry 34 as the power level input into the sliding bias controller 98 to ultimately control the bias currents generated by the base bias circuits 100, 102 and thus the quiescent currents. The power detector 34 may employ a high bandwidth low pass filter that is easily integrated into a monolithic microwave integrated circuit (MMIC).

Figure 7:
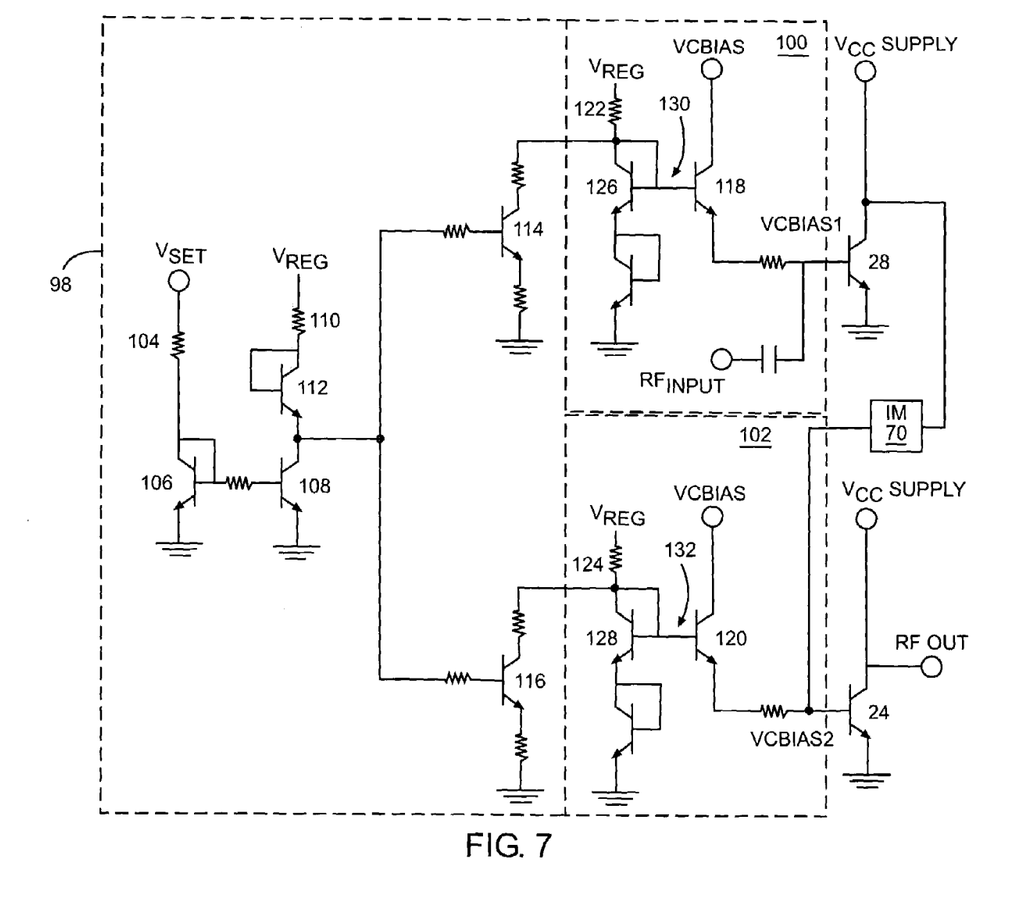
FIG. 7 illustrates one embodiment of the sliding bias controller employed by the present invention to control the quiescent current at lower power output levels to increase power amplifier efficiency.

FIG. 7 illustrates one embodiment of the sliding bias controller 98 that may be used in the present invention. A common sliding bias controller 98 is employed to control the bias currents generated by both base bias circuits 100, 102 as shown which in turn control the quiescent currents of the power amplifiers 24, 28. VSET is the output from the power detector 34, which also controls the control voltage (VSET) of the DC to DC converter 26. At low power levels, the voltage VSET applied to collector resistor 104 is not at a high enough voltage level to create a sufficient current to turn on transistors 106, 108. Thus, the current path for the current generated by voltage VREG applied to collector resistor 110 flows through a transistor 112 to the base of transistors 114, 116 in the base bias circuits 100, 102. Thus, transistors 114, 116 draw some part of the bias currents for each of the base bias circuits 100, 102 from their respective of current mirror transistors 118, 120, to reduce the quiescent currents of the amplifiers 24, 28.

The bias current generated by the base bias circuits 100, 102 to generate the base current input into the power amplifiers 24, 28 results from the fixed voltage VREG applied to resistors 122, 124. The resulting current drives the base and collector of transistors 126, 128 that form current mirrors 130, 132 to drive the base of transistors 118, 120 with the same current. This causes the transistors 118, 120 to turn on, thus creating the final bias currents that drive the base of the output amplifiers 24, 28, thereby controlling their quiescent currents that contribute to their power consumption.

As the power level of the RF input signal (RF INPUT) increases, voltage VSET increases in kind. Eventually, VSET will reach a sufficient threshold voltage level where on transistors 106, 108 begin to turn on. During this gradual change, current from transistor 112 will being to flow through transistor 108 and less current will flow to the base of transistors 114, 116. Eventually when VSET is high enough transistors 114, 116 will begin to turn off and the circuit of the sliding bias controller 98 will eventually be isolated from the current mirrors 130, 132 in the base bias circuits 100, 102. At this point, the bias currents flowing into the base of power amplifiers 24, 28 will be at their nominal or normal level and unaffected by the sliding bias controller 98. Hence the term "sliding", since the sliding bias controller 98 controls the bias current as the power level voltage VSET slides from a higher power level to a lower power level.

Figure 8:
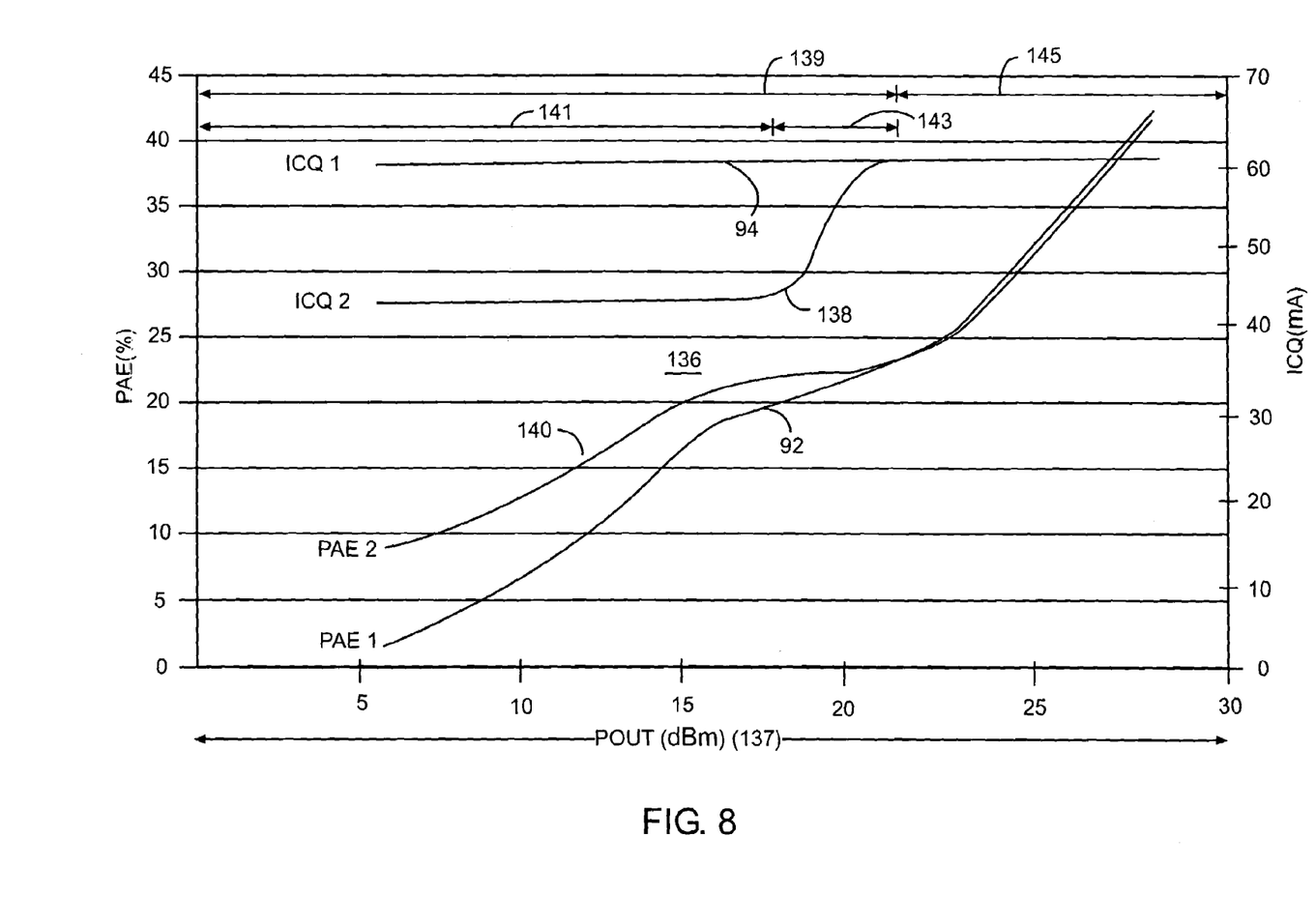
FIG. 8 illustrates an example of power amplifier efficiency curve of the power amplifier circuit of FIGS. 2 and 6 demonstrating power amplifier efficiency with and without control of quiescent current.

FIG. 8 illustrates an exemplary power efficiency improvement diagram 136 that is realized in the final stage power amplifier 24 with and without employing the sliding bias controller 98 of the present invention. Just as illustrated in FIG. 5, the power efficiency of the final amplifier stage 24 of two stage power amplifier circuit 96 without employing the sliding bias controller 98 is illustrated as the PAE1 92. The quiescent current (ICQ1) is at its nominal level through the entire power output range 137 of the final stage amplifier 24.

By employing the sliding bias controller 98 of the present invention, the quiescent current (ICQ2) 138 is reduced at lower power levels in the lower power range 139 as shown in FIG. 8, thereby resulting in less power consumption by the power amplifier 24. The lower power range 139 is comprised of a low end power range 141 and a transitional power range 143. The sliding bias controller 98 begins to lessen its reduction of the bias current in the transitional power range 143 until the quiescent current reaches its nominal level in the upper power range 145. This results in an improved efficiency for power amplifier 24, illustrated as PAE2 140.

In summary, the two stage power amplifier circuit 96 in the illustrated embodiment illustrates improved PAE by use of both a controllable supply voltage, such as the DC to DC converter 26, as well as the sliding bias controller 98. This reduces both supply voltage of the second stage amplifier 24 and quiescent current of both power amplifier stages 24, 28 to reduce the overall power consumption over the power level range 137 and improve PAE.

Figure 9:
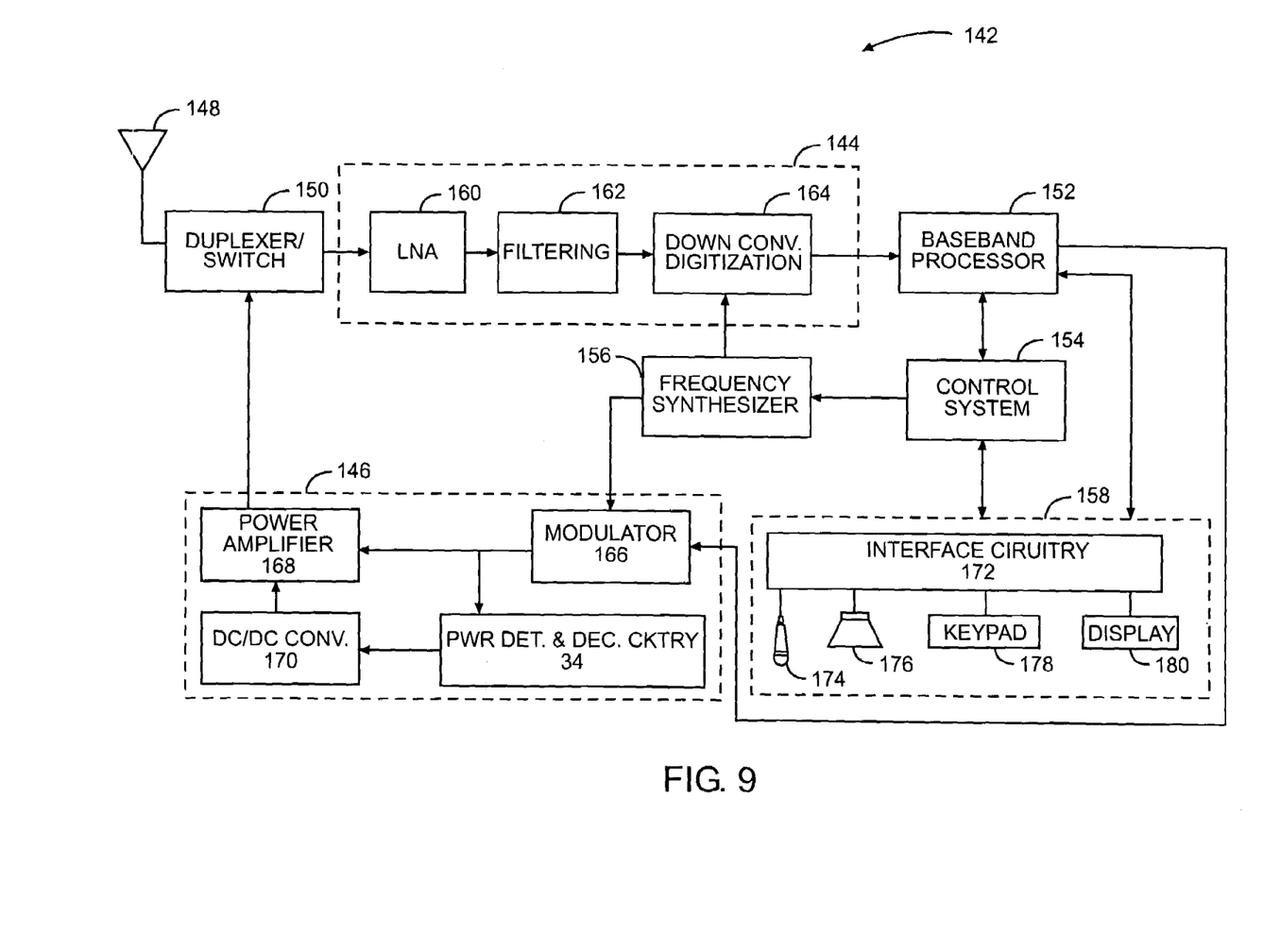
FIG. 9 shows an application of the invention used as a mobile terminal.

An application example of a power detector and decision circuit 34 is its use in a mobile terminal 142. The basic architecture of the mobile terminal 142 is represented in FIG. 9 and may include a receiver front end 144, a radio frequency transmitter section 146, an antenna 148, a duplexer or switch 150, a baseband processor 152, a control system 15, a frequency synthesizer 156, and an interface 158. The receiver front end 144 receives information bearing radio frequency signals from one or more remote transmitters provided by a base station. A low noise amplifier (LNA) 160 amplifies the signal. A filter circuit 162 minimizes broadband interference in the received signal, while downconversion and digitization circuitry 164 downconverts the filtered, received signal to an intermediate or baseband frequency signal, which is then digitized into one or more digital streams. The receiver front end 144 typically uses one or more mixing frequencies generated by the frequency synthesizer 156. The baseband processor 152 processes the digitized received signal to extract the information or data bits conveyed in the received signal. This processing typically comprises demodulation, decoding, and error correction operations. As such, the baseband processor 152 is generally implemented in one or more digital signal processors (DSPs). The downconversion and digitization circuitry 164 measures the strength of the received signal and selects the appropriate mode of operation for the LNA 160.

On the transmit side, the baseband processor 152 receives digitized data, which may represent voice, data, or control information, from the control system 154, which it encodes for transmission. The encoded data is output to the transmitter 146, where it is used by a modulator 166 to modulate a carrier signal that is at a desired transmit frequency. Power amplifier circuitry 168 amplifies the modulated carrier signal to a level appropriate for transmission, and delivers the amplified and modulated carrier signal to the antenna 148 through the duplexer or switch 150. The power detector and decision circuit 34 measures the magnitude of the modulated carrier signal and sends a control voltage to a DC to DC converter 170, which applies the proper DC supply voltage to the power amplifier circuitry 168.

A user may interact with the mobile terminal 142 via the interface 158, which may include interface circuitry 172 associated with a microphone 174, a speaker 176, a keypad 178, and a display 180. The interface circuitry 158 typically includes analog-to-digital converters, digital-to-analog converters, amplifiers, and the like. Additionally, it may include a voice encoder/decoder, in which case it may communicate directly with the baseband processor 152. The microphone 174 will typically convert audio input, such as the user's voice, into an electrical signal, which is then digitized and passed directly or indirectly to the baseband processor 152. Audio information encoded in the received signal is recovered by the baseband processor 152, and converted by the interface circuitry 158 into an analog signal suitable for driving the speaker 176. The keypad 178 and display 180 enable the user to interact with the mobile terminal 142, input numbers to be dialed, address book information, or the like, as well as monitor call progress information.

Those skilled in the art will recognize improvements and modifications to the embodiments of the present invention. All such improvements and modifications are considered within the scope of the concepts disclosed herein and the claims that follow.

What is claimed is:

1. A power amplifier circuit adapted to efficiently amplify a radio-frequency (RF) input signal into an RF output signal, comprising:
   a power detector adapted to:
      a) receive a signal based of the RF input signal; and
      b) generate a power level signal indicative of the power level of the RF input signal, which is provided to a power amplifier; and
      c) provide the power level signal to a controllable supply voltage to control operation of the power amplifier; and
   a sliding bias controller adapted to:
      receive the power level signal; and
      control a quiescent current of a power amplifier by providing a control signal based on the power level signal to control a bias current, which is generated by a bias circuit and provided to the power amplifier to control operation point of the power amplifier.

2. The power amplifier circuit of claim 1, wherein the signal based on the RF input signal is generated by a prior stage power amplifier that is adapted to receive the RF input signal.

3. The power amplifier circuit of claim 1, wherein the quiescent current is less in a lower power range of a power level range of the power amplifier than in an upper power range of the power level range of the power amplifier.

4. The power amplifier circuit of claim 3, wherein the lower power range is comprised of a low end power range and a transitional power range between the low end power range and the upper power range, wherein the quiescent current is substantially constant in the low end power range, and increases through the transitional power range until reaching the upper power range.

5. The power amplifier circuit of claim 4, wherein the quiescent current is substantially constant in the upper power range.

6. The power amplifier circuit of claim 5, wherein the quiescent current in the upper power range is at the current level when the bias current generated by the bias circuit is at its nominal level.

7. The power amplifier circuit of claim 1, wherein the controllable supply voltage is a DC to DC converter.

8. The power amplifier circuit of claim 2, wherein the sliding bias controller is further adapted to provide a control signal to control a prior stage quiescent current by controlling a prior stage bias current generated by a prior stage bias circuit and provided to the prior stage power amplifier to control the operation point of the prior stage power amplifier.

9. The power amplifier circuit of claim 8, wherein the prior stage quiescent current is less in a lower power range of a power level range of the prior stage power amplifier than in an upper power range of the power level range of the prior stage power amplifier.

10. The power amplifier circuit of claim 9, wherein the lower power range of the prior stage power amplifier is comprised of a low end power range of the prior stage power amplifier and a transitional power range of the prior stage power amplifier between the low end power range of the prior stage power amplifier and the upper power range of the prior stage power amplifier, wherein the prior stage quiescent current is substantially constant in the low end power range of the prior stage power amplifier, and increases through the transitional power range of the prior stage power amplifier until reaching the upper power range of the prior stage power amplifier.

11. The power amplifier circuit of claim 10, wherein the prior stage quiescent current is substantially constant in the upper power range of the prior stage power amplifier.

12. The power amplifier circuit of claim 1, wherein the power detector is a bipolar power detector.

13. The power amplifier circuit of claim 1, wherein the sliding bias controller is isolated from the bias circuit and does not control the bias current.

14. The power amplifier circuit of claim 1, wherein the sliding bias controller includes a current mirror that allows a portion of bias current to drain away from the power amplifier when not activated.

15. A method of controlling the quiescent current of a power amplifier to control the power amplifier bias voltage to improve power amplifier efficiency, comprising the steps of:

generating a power level signal indicative of a power level of a RF input signal;

providing the power level signal to a controllable supply voltage to control operation of the power amplifier that receives a signal indicative of the RF input signal in response to the power level signal; and providing the power level signal to a sliding bias controller and controlling a quiescent current of a power amplifier by controlling a bias current which is generated by a bias circuit based on the power level signal that is provided to the power amplifier to control the operation point of the power amplifier.

16. The method of claim 15, wherein the power level signal based on the RF input signal is generated by a prior stage power amplifier that is adapted to receive the RF input signal.

17. The method of claim 15, further comprising controlling the quiescent current to be less in a lower power range of a power level range of the power amplifier than in an upper power range of the power level range of the power amplifier.

18. The method of claim 17, wherein the lower power range is comprised of a low end power range and a transitional power range between the low end power range and the upper power range, and further comprising:

controlling the quiescent current to be substantially constant in the low end power range; and increasing the quiescent current through the transitional power range until reaching the upper power range.

19. The method of claim 18, further comprising controlling the quiescent current to be substantially constant in the upper power range.

20. The method of claim 19, further comprising controlling the quiescent current in the upper power range to be at the current level when the bias current generated by the bias circuit is at its nominal level.

21. The method of claim 16, further comprising providing a control signal to control a prior stage quiescent current by controlling a prior stage bias current generated by a prior stage bias circuit and provided to the prior stage power amplifier to control the operation point of the prior stage power amplifier.

22. The method of claim 21, further comprising the prior stage quiescent current to be less in a lower power range of a power level range of the prior stage power amplifier than in an upper power range of the power level range of the prior stage power amplifier.

23. The method of claim 22, wherein the lower power range of the prior stage power amplifier is comprised of a low end power range of the prior stage power amplifier and a transitional power range of the prior stage power amplifier between the low end power range of the prior stage power amplifier and the upper power range of the prior stage power amplifier, and further comprising:

controlling the prior stage quiescent current to be substantially constant in the first power range of the prior stage power amplifier; and increasing the prior stage quiescent current through the transitional power range of the prior stage power amplifier until reaching the upper power range of the prior stage power amplifier.

24. The method of claim 23, further comprising controlling the prior stage quiescent current to be substantially constant in the upper power range of the prior stage power amplifier.

25. The method of claim 15, further comprising isolating the sliding bias controller from the bias circuit so that the sliding bias controller does not control the bias current.

26. The method of claim 15, further comprising draining a portion of the quiescent current away from the power amplifier to control the quiescent current based on the power level signal.

* * * * *